United States Patent
Kim

(10) Patent No.: US 10,395,602 B2
(45) Date of Patent: Aug. 27, 2019

(54) DISPLAY DEVICE

(71) Applicant: LG Display Co., Ltd., Seoul (KR)

(72) Inventor: Joonki Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 225 days.

(21) Appl. No.: 15/363,170

(22) Filed: Nov. 29, 2016

(65) Prior Publication Data

US 2017/0154580 A1    Jun. 1, 2017

(30) Foreign Application Priority Data

Nov. 30, 2015    (KR) .......................... 10-2015-0169475

(51) Int. Cl.
| | |
|---|---|
| *G09G 3/3291* | (2016.01) |
| *H01L 27/32* | (2006.01) |
| *H01L 51/52* | (2006.01) |
| *G09G 3/3266* | (2016.01) |
| *G09G 3/3275* | (2016.01) |
| *G09G 3/36* | (2006.01) |

(52) U.S. Cl.
CPC ......... *G09G 3/3291* (2013.01); *G09G 3/3266* (2013.01); *G09G 3/3275* (2013.01); *G09G 3/3688* (2013.01); *H01L 27/3276* (2013.01); *H01L 51/5237* (2013.01); *G09G 2300/0809* (2013.01); *G09G 2310/0286* (2013.01); *G09G 2310/0289* (2013.01); *G09G 2310/0291* (2013.01); *G09G 2310/0297* (2013.01)

(58) Field of Classification Search
CPC ... G09G 2300/0809; G09G 2310/0286; G09G 2310/0289; G09G 2310/0291; G09G 2310/0297; G09G 3/3266; G09G 3/3275; G09G 3/3291; G09G 3/3688; H01L 27/3276; H01L 51/5237
See application file for complete search history.

(56) References Cited

U.S. PATENT DOCUMENTS

| | | | | |
|---|---|---|---|---|
| 8,228,276 | B2 * | 7/2012 | Lee ...................... | G09G 3/3614 345/204 |
| 9,449,993 | B2 * | 9/2016 | Kim ...................... | H01L 27/124 |
| 9,747,843 | B2 * | 8/2017 | Na ........................ | G09G 3/3291 |
| 2004/0075783 | A1 * | 4/2004 | Lee ...................... | G02F 1/13454 349/43 |
| 2007/0296675 | A1 * | 12/2007 | Lee ...................... | G09G 3/3614 345/98 |

(Continued)

*Primary Examiner* — Afroza Chowdhury
(74) *Attorney, Agent, or Firm* — Morgan, Lewis & Bockius LLP

(57) ABSTRACT

A display device includes a display panel including data lines, a data driver outputting a data voltage to be supplied to the data lines to a source line, and a multiplexer distributing the data voltage received from the source line to the data lines in response to an enable signal received through an enable signal line. The multiplexer includes a plurality of switching elements each including a drain electrode connected to the source line, a source electrode connected to the data line, and a gate electrode supplied with the enable signal. The enable signal is transferred from the enable signal line to the gate electrode via an enable signal pattern. The enable signal pattern is disposed on a metal layer different from the switching elements with an insulating layer interposed between them in a formation area of the switching elements.

4 Claims, 9 Drawing Sheets

(56) References Cited

U.S. PATENT DOCUMENTS

| | | | |
|---|---|---|---|
| 2008/0079703 A1* | 4/2008 | Yamagami | G09G 3/3614 345/205 |
| 2016/0190166 A1* | 6/2016 | Kim | H01L 27/124 257/71 |
| 2016/0210904 A1* | 7/2016 | Na | G09G 3/3291 |

* cited by examiner

DISPLAY DEVICE

DISPLAY DEVICE

This application claims the benefit of Korea Patent Application No. 10-2015-0169475 filed on Nov. 30, 2015, the entire contents of which is incorporated herein by reference for all purposes as if fully set forth herein.

BACKGROUND OF THE INVENTION

Field of the Invention

The present disclosure relates to a display device.

Discussion of the Related Art

Examples of a flat panel display include a liquid crystal display (LCD), a field emission display (FED), a plasma display panel (PDP), and an organic light emitting diode (OLED) display. In the flat panel display, data lines and gate lines are arranged to intersect each other, and each intersection of the data lines and the gate lines is defined as pixel. The plurality of pixels are formed on a display panel of the flat panel display in a matrix. The flat panel display supplies a video data voltage to the data lines and sequentially supplies a gate pulse to the gate lines, thereby driving the pixels. The flat panel display supplies the video data voltage to the pixels of a display line, to which the gate pulse is supplied, and sequentially scans all of the display lines in response to the gate pulse, thereby displaying video data.

The data voltage supplied to the data line is generated in a data driver and is provided for the data line. The data voltage output from each channel of the data driver is generally supplied to each data line. In order to recently simplify a circuit configuration of the data driver, the data voltage output through one channel of the data driver is distributed to the plurality of data lines using a multiplexer.

The multiplexer includes a plurality of switching elements, each of which may be implemented as a transistor. An enable signal controlling each switching element is applied via an enable line. The multiplexer is disposed between the data driver and a display portion of the display panel, in which the pixels are disposed. As a result, the multiplexer leads to an increase in size of a bezel.

SUMMARY

Accordingly, the present invention is directed to a display device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a display device comprises a display panel including data lines, a data driver configured to output a data voltage to be supplied to the data lines to a source line, and a multiplexer configured to distribute the data voltage received from the source line to the data lines in response to an enable signal received through an enable signal line, the multiplexer including a plurality of switching elements each including a drain electrode connected to the source line, a source electrode connected to the data line, and a gate electrode supplied with the enable signal, wherein the enable signal is transferred from the enable signal line to the gate electrode via an enable signal pattern, wherein the enable signal pattern is disposed on a metal layer different from the switching elements with an insulating layer interposed between them in a formation area of the switching elements.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
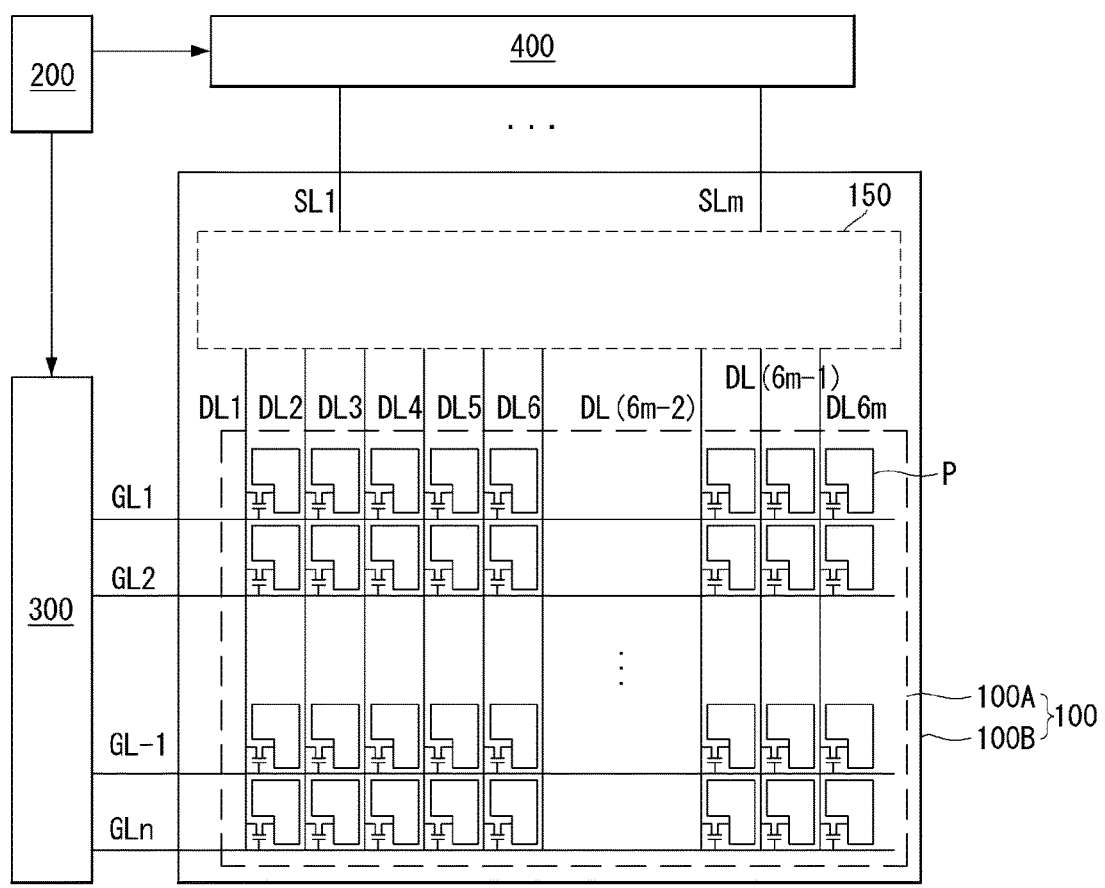
FIG. 1 illustrates a display device according to an example embodiment.
Figure 2:
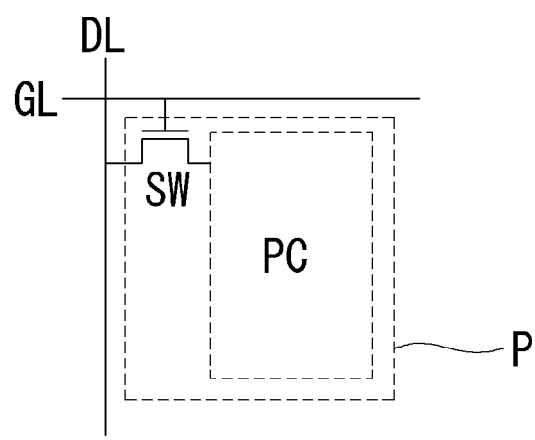
FIG. 2 illustrates an example of a pixel shown in FIG. 1.

Reference will now be made in detail to embodiments of the present disclosure, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout.

FIG. 1 illustrates a display device according to an example embodiment.

Referring to FIG. 1, a display device according to an example embodiment includes a display panel 100, a timing controller 200, a gate driver 300, and a data driver 400.

The display panel 100 includes a display area 100A, in which pixels P are formed, and a non-display area 100B, positioned outside the display area 100A, in which various signal lines, pads, etc. are formed. The display area 100A includes the plurality of pixels P and displays an image based on a gray level represented by each pixel P. The pixels P are arranged on each horizontal line in a matrix. Each pixel P is formed at an intersection of a data line DL and a gate line GL intersecting each other. The gate line GL includes first to mth gate lines GL1 to GLm, where m is a natural number. Each pixel P includes a pixel circuit PC that operates in response to a data signal DATA synchronized with a scan signal supplied through a pixel switching element SW connected to the data line DL and the gate line GL. The pixel circuit PC and the pixel switching element SW may be implemented in different types depending on types of the display panel 100.

A multiplexer 150 is disposed in the non-display area 100B between the data driver 400 and the display area 100A and distributes a data voltage received from a source line SL to the plurality of data lines DL. A structure and an operation of the multiplexer 150 are described later.

The timing controller 200 receives digital video data RGB and timing signals, such as a vertical sync signal Vsync, a horizontal sync signal Hsync, a data enable signal DE, and a main clock CLK, from an external host. The timing controller 200 transmits the digital video data RGB to the data drivers 400. The timing controller 200 generates a source timing enable signal for controlling operation timing of the data driver 400 and a gate timing enable signal for controlling operation timing of a level shifter and a shift register of the gate driver 300 using the timing signals Vsync, Hsync, DE, and CLK. The timing controller 200 supplies an enable signal for controlling the multiplexer 150 to the multiplexer 150. The enable signal may be generated by not the timing controller 200 but a separate configuration.

The gate driver 300 outputs a gate pulse Gout in response to the gate timing enable signal. The gate timing enable signal includes a gate start pulse GSP, a gate shift clock GSC, and a gate output enable signal GOE. The gate start pulse GSP indicates a start gate line, on which the gate driver 300 outputs a first gate pulse Gout. The gate shift clock GSC is a clock for shifting the gate start pulse GSP. The gate output enable signal GOE sets an output period of the gate pulse Gout.

Figure 3:
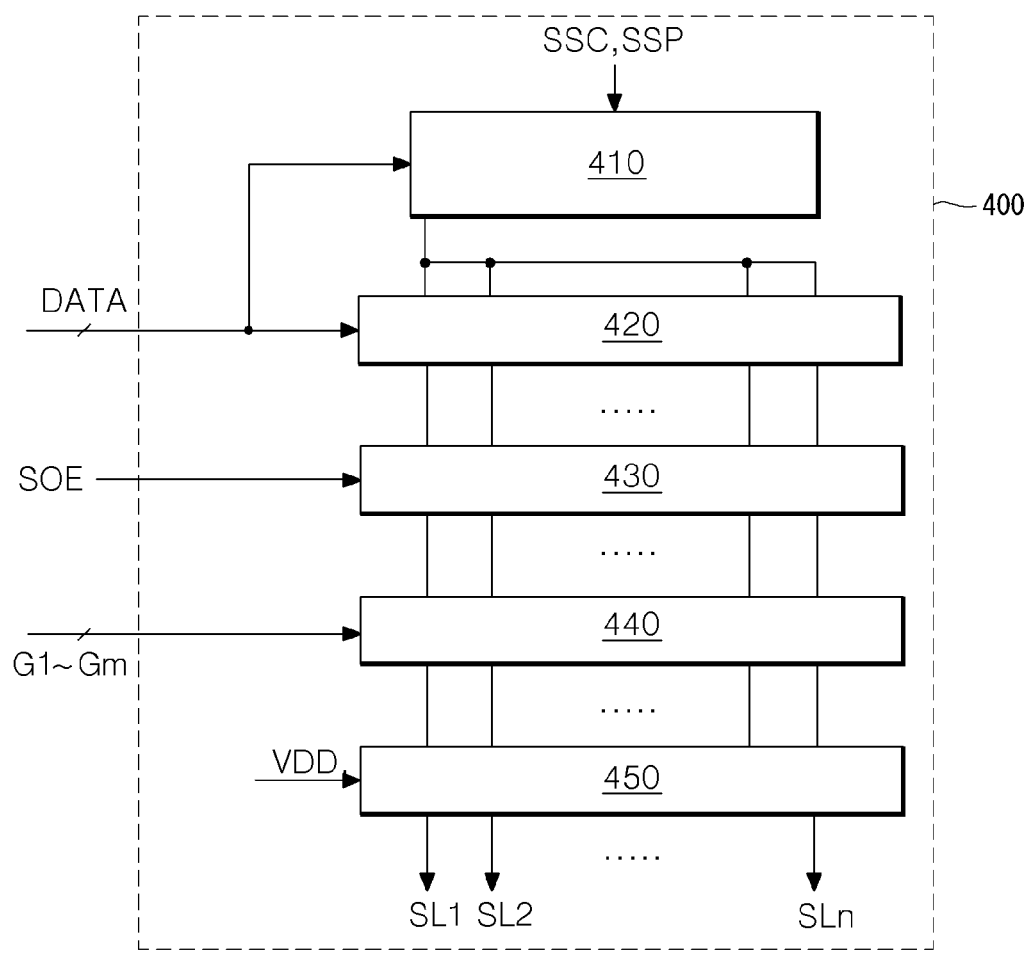
FIG. 3 illustrates an example of a data driver.

As shown in FIG. 3, the data driver 400 includes a register 410, a first latch 420, a second latch 430, a digital-to-analog converter (DAC) 440, and an output unit 450. The register 410 samples bits of the digital video data RGB of an input image in response to data enable signals SSC and SSP received from the timing controller 200 and supplies them to the first latch 420. The first latch 420 samples and latches bits of the digital video data RGB in response to a clock sequentially received from the register 410. Then, the first latch 420 simultaneously outputs the latched digital video data RGB to the second latch 430. The second latch 430 latches data received from the first latch 420 and simultaneously outputs the latched data in response to a source output enable signal SOE in synchronization with a second latch 430 of other data driver 400. The DAC 440 converts the digital video data input from the second latch 430 into a gamma compensation voltage GMA and generates an analog video data voltage. The output unit 450 supplies an analog data voltage ADATA output from the DAC 440 to the data lines DL during a low logic period of the source output enable signal SOE. The output unit 450 may be implemented as an output buffer for outputting the data voltage using a low potential voltage GND and a driving voltage received through a high potential input terminal.

The multiplexer 150 distributes the data voltage, which the data driver 400 outputs to the source line SL, to the plurality of data lines DL. Hereinafter, example embodiments are described based on an example where the six data lines DL are connected to one source line SL.

Figure 4:
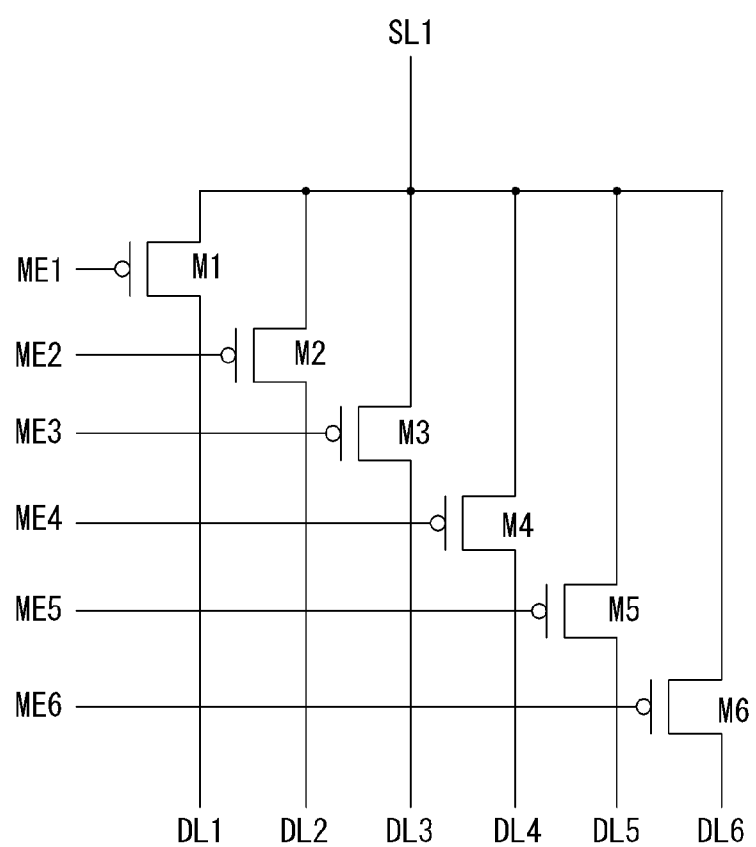
FIG. 4 illustrates a multiplexer according to an example embodiment.

FIG. 4 illustrates a multiplexer according to an example embodiment.

Referring to FIG. 4, the multiplexer 150 according to the embodiment includes first to sixth switching elements M1 to M6 that operate in response to first to sixth enable signals ME1 to ME6, respectively.

Each of the first to third enable signals ME1 to ME3 is output during ⅙ horizontal period, so as to scan six data lines during one horizontal period 1H. In the same manner as the first to third enable signals ME1 to ME3, each of the fourth to sixth enable signals ME4 to ME6 is output during ⅙ horizontal period.

The first switching element M1 supplies the data voltage received via a first source line SL1 to a first data line DL1 in response to the first enable signal ME1. The second switching element M2 supplies the data voltage received via the first source line SL1 to a second data line DL2 in response to the second enable signal ME2. The third switching element M3 supplies the data voltage received via the first source line SL1 to a third data line DL3 in response to the third enable signal ME3. The fourth switching element M4 supplies the data voltage received via the first source line SL1 to a fourth data line DL4 in response to the fourth enable signal ME4. The fifth switching element M5 supplies the data voltage received via the first source line SL1 to a fifth data line DL5 in response to the fifth enable signal ME5. The sixth switching element M6 supplies the data voltage received via the first source line SL1 to a sixth data line DL6 in response to the sixth enable signal ME6.

Figure 5:
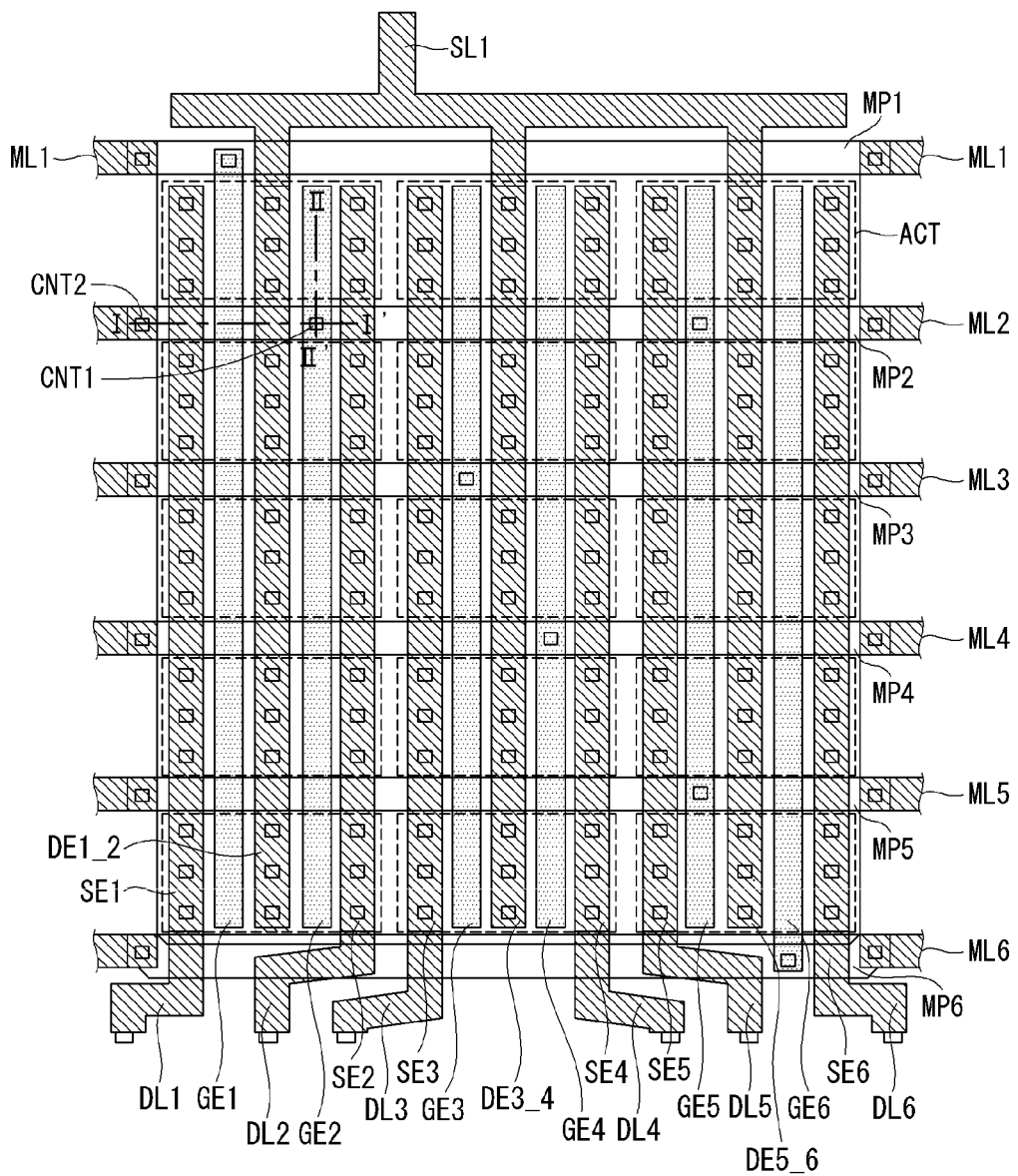
FIG. 5 illustrates an array of a multiplexer according to an example embodiment.
Figure 6:
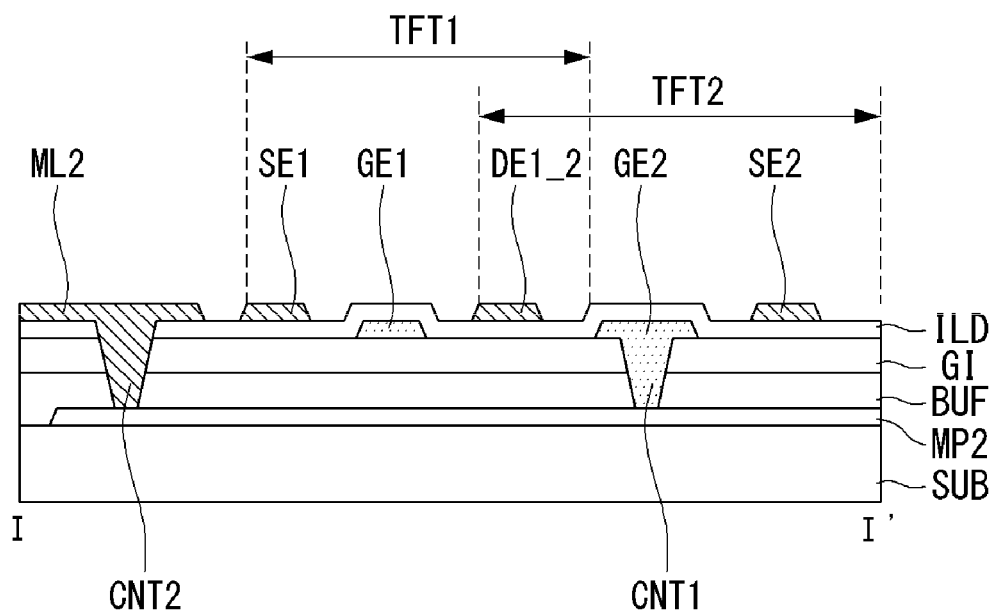
FIG. 6 is a cross-sectional view taken along line I-I' of FIG. 5.
Figure 7:
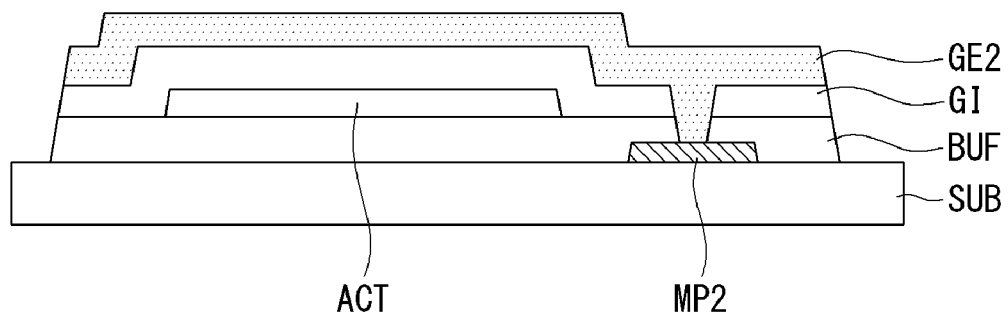
FIG. 7 is a cross-sectional view taken along line II-II' of FIG. 5.

FIG. 5 illustrates an array structure of a multiplexer according to an example embodiment. FIG. 6 is a cross-sectional view taken along line I-I' of FIG. 5. FIG. 7 is a cross-sectional view taken along line II-II' of FIG. 5. FIGS. 5 to 7 illustrate first to sixth switching elements connected to a first source line.

Referring to FIGS. 5 to 7, the multiplexer 150 according to the embodiment includes the first to sixth switching elements M1 to M6 connected to the first source line SL1.

The first source line SL1 is branched into a 1-2 drain electrode DE1_2, a 3-4 drain electrode DE3_4, and a 5-6 drain electrode DE5_6. The 1-2 drain electrode DE1_2 is shared with the first and second switching elements M1 and M2, the 3-4 drain electrode DE3_4 is shared with the third and fourth switching elements M3 and M4, and the 5-6 drain electrode DE5_6 is shared with the fifth and sixth switching elements M5 and M6.

The first switching element M1 includes the 1-2 drain electrode DE1_2, a first source electrode SE1, and a first gate electrode GE1. The second switching element M2 includes the 1-2 drain electrode DE1_2, a second source electrode SE2, and a second gate electrode GE2. The first and second gate electrodes GE1 and GE2 are respectively disposed on both sides of the 1-2 drain electrode DE1_2. The first source electrode SE1 is disposed adjacent to the 1-2 drain electrode DE1_2 with the first gate electrode GE1 interposed between them. The second source electrode SE2 is disposed adjacent to the 1-2 drain electrode DE1_2 with the second gate electrode GE2 interposed between them.

The first switching element M1 supplies the data voltage applied to the 1-2 drain electrode DE1_2 to the first data line DL1 through the first source electrode SE1 in response to the first enable signal ME1 applied to the first gate electrode GE1. The first enable signal ME1 is applied to the first gate electrode GE1 via a first enable signal line ML1 and a first enable signal pattern MP1.

The second switching element M2 supplies the data voltage applied to the 1-2 drain electrode DE1_2 to the second data line DL2 through the second source electrode SE2 in response to the second enable signal ME2 applied to the second gate electrode GE2. The second enable signal ME2 is applied to the second gate electrode GE2 via a second enable signal line ML2 and a second enable signal pattern MP2.

The third switching element M3 includes the 3-4 drain electrode DE3_4, a third source electrode SE3, and a third gate electrode GE3. The fourth switching element M4 includes the 3-4 drain electrode DE3_4, a fourth source electrode SE4, and a fourth gate electrode GE4. The third and fourth gate electrodes GE3 and GE4 are respectively disposed on both sides of the 3-4 drain electrode DE3_4. The third source electrode SE3 is disposed adjacent to the 3-4 drain electrode DE3_4 with the third gate electrode GE3 interposed between them. The fourth source electrode SE4 is disposed adjacent to the 3-4 drain electrode DE3_4 with the fourth gate electrode GE4 interposed between them.

The third switching element M3 supplies the data voltage applied to the 3-4 drain electrode DE3_4 to the third data line DL3 through the third source electrode SE3 in response to the third enable signal ME3 applied to the third gate electrode GE3. The third enable signal ME3 is applied to the third gate electrode GE3 via a third enable signal line ML3 and a third enable signal pattern MP3.

The fourth switching element M4 supplies the data voltage applied to the 3-4 drain electrode DE3_4 to the fourth data line DL4 through the fourth source electrode SE4 in response to the fourth enable signal ME4 applied to the fourth gate electrode GE4. The fourth enable signal ME4 is applied to the fourth gate electrode GE4 via a fourth enable signal line ML4 and a fourth enable signal pattern MP4.

The fifth switching element M5 includes the 5-6 drain electrode DE5_6, a fifth source electrode SE5, and a fifth gate electrode GE5. The sixth switching element M6 includes the 5-6 drain electrode DE5_6, a sixth source electrode SE6, and a sixth gate electrode GE6. The fifth and sixth gate electrodes GE5 and GE6 are respectively disposed on both sides of the 5-6 drain electrode DE5_6. The fifth source electrode SE5 is disposed adjacent to the 5-6 drain electrode DE5_5 with the fifth gate electrode GE5 interposed between them. The sixth source electrode SE6 is disposed adjacent to the 5-6 drain electrode DE5_6 with the sixth gate electrode GE6 interposed between them.

The fifth switching element M5 supplies the data voltage applied to the 5-6 drain electrode DE5_6 to the fifth data line DL5 through the fifth source electrode SE5 in response to the fifth enable signal ME5 applied to the fifth gate electrode GE5. The fifth enable signal ME5 is applied to the fifth gate electrode GE5 via a fifth enable signal line ML5 and a fifth enable signal pattern MP5.

The sixth switching element M6 supplies the data voltage applied to the 5-6 drain electrode DE5_6 to the sixth data line DL6 through the sixth source electrode SE6 in response to the sixth enable signal ME6 applied to the sixth gate electrode GE6. The sixth enable signal ME6 is applied to the sixth gate electrode GE6 via a sixth enable signal line ML6 and a sixth enable signal pattern MP6.

The first to sixth enable signal patterns MP1 to MP6 are disposed in an area overlapping the first to sixth switching elements M1 to M6. The first to sixth enable signal patterns MP1 to MP6 may be formed in the same area of the plane by patterning a metal layer different from the first to sixth switching elements M1 to M6.

Each of the first to sixth enable signal patterns MP1 to MP6 are connected to the gate electrode and the enable signal line through a contact hole. For example, the second enable signal pattern MP2 is connected to the second gate electrode GE2 through a first contact hole CNT1. Further, the second enable signal pattern MP2 is connected to the second enable signal line ML2 through a second contact hole CNT2.

A cross-sectional structure of the switching elements is described below with reference to FIGS. 6 and 7. FIGS. 6 and 7 illustrate a formation area of a second enable signal pattern. However, the same configuration of the switching elements may be formed using the same material and the same method. Hereinafter, the cross-sectional structure of the switching elements is described using one switching element by way of example. For example, FIGS. 6 and 7 illustrate only the second enable signal pattern, but the first to sixth enable signal patterns are commonly referred to as an enable signal pattern MP and are described.

An enable signal pattern MP is patterned on a substrate SUB using a metal layer. A buffer layer BUF may be formed to cover the enable signal pattern MP. A semiconductor active layer ACT is disposed on the buffer layer BUF, and a gate insulating layer GI is formed cover the buffer layer BUF. The semiconductor active layer ACT may be formed to cover an area, in which a gate electrode GE, a source electrode SE, and a drain electrode DE will be disposed. The semiconductor active layer ACT does not overlap the enable signal pattern MP on the plane.

The gate electrode GE is disposed on the gate insulating layer GI. Before forming the gate electrodes GE, the buffer layer BUF and the gate insulating layer GI are etched so that the enable signal pattern MP is exposed in a contact area. As the gate electrode GE is formed in a state where the enable signal pattern MP is exposed in the contact area, the gate electrode GE and the enable signal pattern MP are connected to each other through a first contact hole CNT1. An interlayer dielectric layer ILD is formed to cover the gate electrode GE. The drain electrode DE, the source electrode SE, and an enable signal line ML are disposed on the interlayer dielectric layer ILD. The enable signal line ML is connected to the enable signal pattern MP through a second contact hole CNT2.

As described above, the multiplexer 150 according to the embodiment disposes the enable signal pattern MP connected to the gate electrode GE of the switching element M in a formation area of the switching element M on the plane. As a result, an area of the enable signal line for applying the enable signal may decreases.

Figure 8:
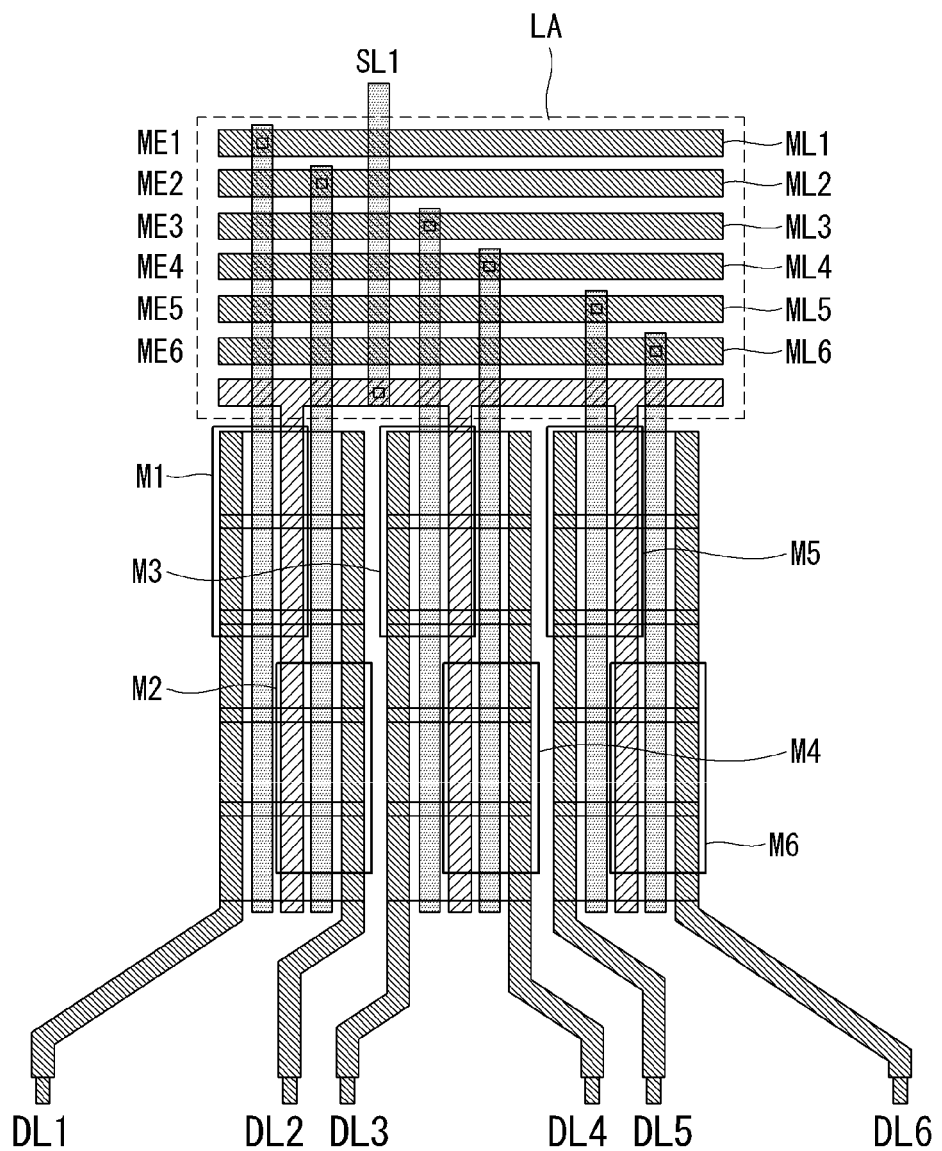
FIG. 8 illustrates a multiplexer according to a comparative example.

The multiplexer 150 according to the embodiment is described below with reference to a comparative example shown in FIG. 8. FIG. 8 illustrates a plane structure of a related art multiplexer. First to sixth switching elements M1 to M6 shown in FIG. 8 are turned on in response to first to sixth control signals ME1 to ME6. The first to sixth control signals ME1 to ME6 are applied through first to sixth enable signal lines ML1 to ML6. The first to sixth enable signal lines ML1 to ML6 are positioned adjacent to the first to sixth switching elements M1 to M6. As shown in FIG. 8, the related art multiplexer includes a signal line area LA, in which the first to sixth enable signal lines ML1 to ML6 are disposed.

On the other hand, in the multiplexer 150 according to the example embodiment, the first to sixth enable signal patterns MP1 to MP6 respectively connected to the first to sixth enable signal lines ML1 to ML6 are disposed to overlap the first to sixth switching elements M1 to M6 on the plane. Therefore, the entire size of the multiplexer 150 according to the example embodiment can decrease. As a result, the size of a bezel, in which the multiplexer 150 is disposed, can decrease.

The example embodiment may be advantageously applied to a portable display device. In particular, the example embodiment may be applied to a circular display panel used in a wearable display device, etc. and thus may be advantageous in a reduction in the size of the circular display device.

Figure 9:
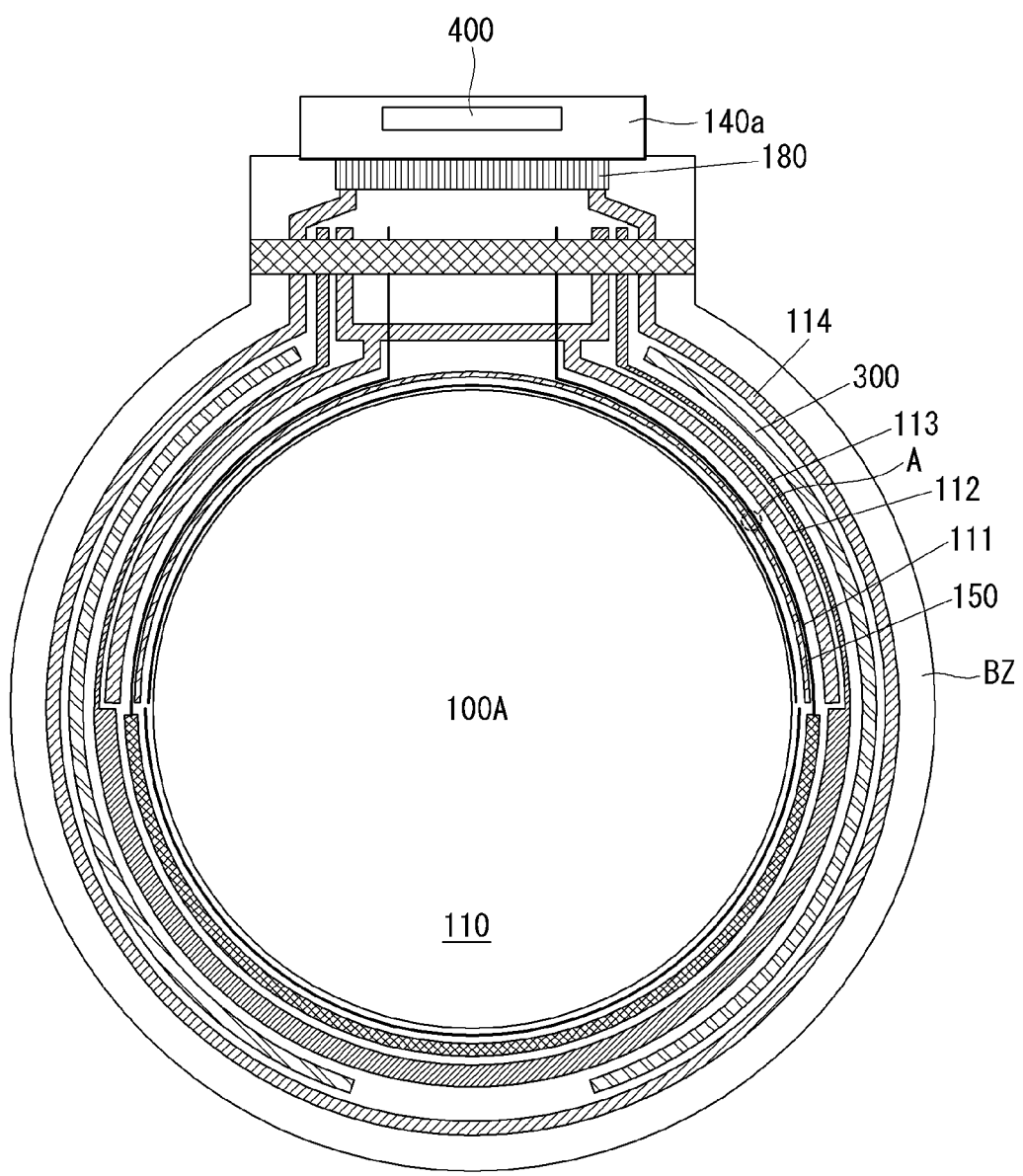
FIG. 9 illustrates a circular display device according to an example embodiment.

FIG. 9 illustrates an example of a free-form display, to which an example embodiment is applied. More specifically, FIG. 9 illustrates a free-form display using an organic light emitting diode (OLED) display panel. However, types of a display panel and types of driving signal lines disposed in a bezel depending on the types of the display panel may vary.

Referring to FIG. 9, a free-form display according to an example embodiment includes a free-form display panel 110 and a display driving circuit for writing data of an input image to pixels disposed in a display area 100A of the free-form display panel 110.

The free-form display panel 110 includes the display area 100A, in which data lines DL, scan lines GL intersecting the data lines DL, pixels defined by the data lines DL and the scan lines GL in a matrix are disposed. The free-form display panel 110 at least includes a curved portion. The free-form display panel 110 includes the display area 100A and a bezel area BZ. The display area 100A includes a pixel array of the free-form display panel 110, and data of an input image is displayed on the display area 100A.

The bezel area BZ is disposed outside the display area 100A. The bezel area BZ includes a multiplexer 150, source lines SL, a high potential line unit 112, a reference voltage line unit 113, a low potential line unit 114, and a gate driver 300.

The gate driver 300 includes a shift register. The shift register includes cascade-connected stages, and each stage outputs a gate pulse supplied to a gate line. The gate driver 300 may be disposed in the bezel area BZ and may be disposed along a curved line of the display area 100A while being spaced apart from the display area 100A by a predetermined distance.

A data driver 400 generates a data voltage to be supplied to the pixels and outputs the data voltage to the source lines SL. The source lines SL are connected to the data driver 400 and are disposed to surround the outside of the display area 100A. When the number of data lines is '6m', where m is a natural number, and a multiplexer of 1-to-6 switching structure is used, the m source lines SL may be used.

The multiplexer 150 is disposed between the display area 100A and the source lines SL and distributes the data voltage received from the source lines SL to the data lines DL.

The source lines SL and the multiplexer 150 are disposed in an upper half of the display area 100A.

Figure 10:
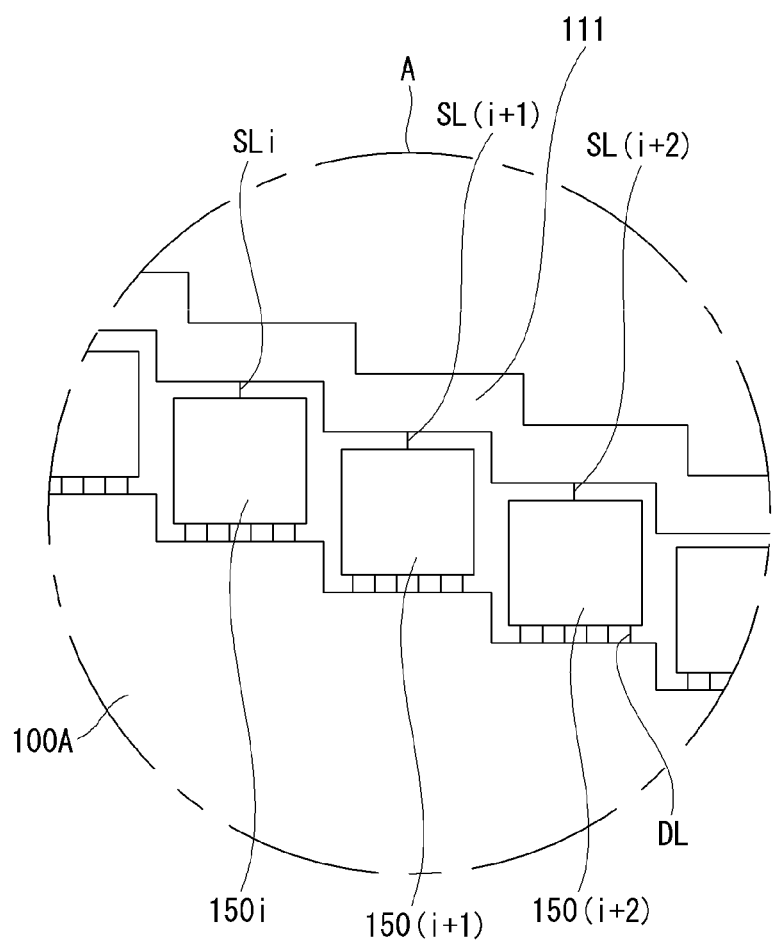
FIG. 10 is an enlarged view of an area 'A' shown in FIG. 9.

FIG. 10 is an enlarged view of an area 'A' shown in FIG. 9. As shown in FIG. 10, adjacent multiplexers 150 are disposed at an outer boundary of the display area 100A and may be disposed in a step shape along the curved surface so as to minimize the bezel of the free-form display.

The high potential line unit 112 supplies a high potential driving voltage VDD output from an electric power generator to the pixels. The high potential driving voltage VDD is used to drive a driving transistor of a compensation pixel or to drive an organic light emitting diode.

The voltage line unit 113 is disposed between the high potential line unit 112 and the gate drive 300. The voltage line unit 113 receives a reference voltage Vref and supplies the reference voltage Vref to the pixels. The reference voltage Vref may be used to initialize a main node of the pixels.

The low potential line unit 114 is disposed along an edge of the gate driver 300. The low potential line unit 114 receives a low potential voltage Vss and supplies the low potential voltage Vss to the pixels.

It will be apparent to those skilled in the art that various modifications and variations can be made in the display device of the present invention without departing from the spirit or scope of the invention. Thus, it is intended that the present invention cover the modifications and variations of this invention provided they come within the scope of the appended claims and their equivalents.

What is claimed is:

1. A display device, comprising:
a display panel including data lines;
a data driver configured to output a data voltage to be supplied to the data lines through a source line; and
a multiplexer configured to distribute the data voltage received from the source line to the data lines in response to an enable signal received through an enable signal line, the multiplexer including a plurality of switching elements each including a drain electrode connected to the source line, a source electrode connected to the data line, and a gate electrode supplied with the enable signal,
wherein the enable signal is transferred from the enable signal line to the gate electrode of each switching element via an enable signal pattern, and
wherein the enable signal pattern is disposed on a metal layer different from the drain electrode, the source electrode, and the gate electrode of each switching element,
wherein the display panel has a curved or circular outer boundary,
wherein the data driver is disposed in an upper half of the display panel along an outside of the display panel,
wherein the display panel comprises another multiplexer,
wherein one multiplexer corresponds to one source line, and
wherein the multiplexers are disposed between the display panel and the data driver in a step shape along the outside of the display panel.

2. The display device of claim 1, wherein the drain electrode, the source electrode, and the gate electrode of each switching element are disposed in parallel with one another, and
wherein the enable signal pattern intersects the drain electrode, the source electrode, and the gate electrode of each switching element.

3. The display device of claim 1, wherein the enable signal pattern is disposed on a substrate,
wherein the gate electrode is disposed on a gate insulating layer covering the enable signal pattern,
wherein the drain electrode, the source electrode, and the enable signal line are disposed on an interlayer dielectric layer covering the gate electrode, and
wherein the enable signal pattern is connected to the gate electrode through a first contact hole penetrating the gate insulating layer and is connected to the enable signal line through a second contact hole penetrating the gate insulating layer.

4. The display device of claim 3, wherein an active layer of each switching element is disposed between the enable signal pattern and the gate insulating layer.

* * * * *